(12) United States Patent
Kim et al.

(10) Patent No.: US 10,586,942 B2
(45) Date of Patent: Mar. 10, 2020

(54) FLEXIBLE DISPLAY APPARATUS

(71) Applicant: Samsung Display Co., Ltd., Yongin-si, Gyeonggi-do (KR)

(72) Inventors: Yongkwan Kim, Yongin-si (KR); Sangwol Lee, Yongin-si (KR); Taehyeog Jung, Yongin-si (KR); Dongwoo Seo, Yongin-si (KR); Ahram Lee, Yongin-si (KR); Jangdoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 15/366,987

(22) Filed: Dec. 1, 2016

(65) Prior Publication Data

US 2017/0162823 A1    Jun. 8, 2017

(30) Foreign Application Priority Data

Dec. 4, 2015 (KR) .......................... 10-2015-0172648

(51) Int. Cl.
*B32B 7/12* (2006.01)
*H01L 51/52* (2006.01)
(Continued)

(52) U.S. Cl.
CPC ............ *H01L 51/5237* (2013.01); *B32B 7/12* (2013.01); *B32B 9/041* (2013.01); *B32B 15/08* (2013.01);
(Continued)

(58) Field of Classification Search
CPC ......... B32B 15/08; B32B 15/09; B32B 17/00; B32B 27/08; B32B 27/281; B32B 27/285; B32B 27/302; B32B 27/306; B32B 27/308; B32B 27/34; B32B 27/36; B32B 27/42; B32B 7/12; B32B 9/041; B32B 2255/10; B32B 2307/40; B32B 2307/50; B32B 2307/546; B32B 2307/7244; B32B 2457/20; B32B 2457/208; G02F 1/13; G02F 1/133305; G06F 1/1652;
(Continued)

(56) References Cited

U.S. PATENT DOCUMENTS 7,418,991 B2     9/2008 Lee et al.
2011/0315968 A1* 12/2011 Nowatari ............ H01L 51/0078
                                                                257/40

(Continued)

FOREIGN PATENT DOCUMENTS

CN    1340573 A    3/2002
CN    1501147 A    6/2004
(Continued)

*Primary Examiner* — Travis M Figg
(74) *Attorney, Agent, or Firm* — Lewis Roca Rothgerber Christie LLP

(57) ABSTRACT

A flexible display apparatus includes a first functional layer, a second functional layer above the first functional layer, a third functional layer above the second functional layer, a first adhesive layer between the first functional layer and the second functional layer, and having a first recovery rate, and a second adhesive layer between the second functional layer and the third functional layer, and having a second recovery rate that is lower than the first recovery rate.

11 Claims, 7 Drawing Sheets

(51) Int. Cl.

| | |
|---|---|
| *B32B 15/08* | (2006.01) |
| *B32B 27/34* | (2006.01) |
| *B32B 27/42* | (2006.01) |
| *B32B 27/30* | (2006.01) |
| *B32B 9/04* | (2006.01) |
| *B32B 27/28* | (2006.01) |
| *B32B 27/36* | (2006.01) |
| *G02F 1/13* | (2006.01) |
| *G06F 1/16* | (2006.01) |
| *B32B 15/09* | (2006.01) |
| *B32B 17/00* | (2006.01) |
| *B32B 27/08* | (2006.01) |
| *H01L 51/00* | (2006.01) |
| *G02F 1/1333* | (2006.01) |
| *H01L 27/32* | (2006.01) |

(52) U.S. Cl.
CPC ............ *B32B 15/09* (2013.01); *B32B 17/00* (2013.01); *B32B 27/08* (2013.01); *B32B 27/281* (2013.01); *B32B 27/285* (2013.01); *B32B 27/302* (2013.01); *B32B 27/306* (2013.01); *B32B 27/308* (2013.01); *B32B 27/34* (2013.01); *B32B 27/36* (2013.01); *B32B 27/42* (2013.01); *G02F 1/13* (2013.01); *G06F 1/1626* (2013.01); *G06F 1/1652* (2013.01); *H01L 51/0097* (2013.01); *B32B 2255/10* (2013.01); *B32B 2307/40* (2013.01); *B32B 2307/50* (2013.01); *B32B 2307/546* (2013.01); *B32B 2307/7244* (2013.01); *B32B 2457/20* (2013.01); *B32B 2457/208* (2013.01); *G02F 1/133305* (2013.01); *H01L 27/323* (2013.01); *H01L 27/3225* (2013.01); *H01L 27/3244* (2013.01); *H01L 2251/5338* (2013.01); *H01L 2251/558* (2013.01); *Y02E 10/549* (2013.01)

(58) Field of Classification Search
CPC ............ H01L 51/0097; H01L 51/5237; H01L 2251/5338; H01L 2251/558; H01L 27/3225; H01L 27/323; H01L 27/3244
See application file for complete search history.

(56) References Cited

U.S. PATENT DOCUMENTS

| | | | |
|---|---|---|---|
| 2012/0098417 A1* | 4/2012 | Inoue | C07F 15/0033 313/504 |
| 2012/0100351 A1* | 4/2012 | Covelli | B32B 5/04 428/196 |
| 2012/0326201 A1* | 12/2012 | Ohnuma | H01L 51/0085 257/99 |
| 2014/0158411 A1 | 6/2014 | Ryu et al. | |
| 2014/0226275 A1 | 8/2014 | Ko et al. | |
| 2014/0329048 A1* | 11/2014 | Jung | H01L 51/5253 428/113 |
| 2014/0355195 A1* | 12/2014 | Kee | G06F 1/1616 361/679.27 |
| 2014/0377552 A1 | 12/2014 | Kurata et al. | |
| 2015/0036301 A1 | 2/2015 | Ooishi | |
| 2015/0043180 A1 | 2/2015 | Lee | |
| 2015/0115235 A1 | 4/2015 | Lee et al. | |
| 2015/0132520 A1* | 5/2015 | Han | B32B 37/12 428/38 |
| 2015/0200375 A1* | 7/2015 | Kim | G09F 9/301 257/40 |
| 2015/0201487 A1 | 7/2015 | Kee et al. | |

FOREIGN PATENT DOCUMENTS

| | | |
|---|---|---|
| CN | 101296561 A | 10/2008 |
| CN | 101894501 A | 11/2010 |
| CN | 102169960 A | 8/2011 |
| CN | 203522831 U | 4/2014 |
| CN | 104011158 A | 8/2014 |
| CN | 104837945 A | 8/2015 |
| CN | 104858105 A | 8/2015 |
| JP | 2010-256503 A | 11/2010 |
| KR | 10-2013-0075525 A | 7/2013 |
| KR | 10-2014-0101295 A | 8/2014 |
| KR | 10-2014-0142004 A | 12/2014 |
| KR | 10-2015-0017273 A | 2/2015 |
| KR | 10-2015-0049189 A | 5/2015 |
| KR | 10-2015-0053635 A | 5/2015 |
| KR | 10-2015-0084257 A | 7/2015 |
| KR | 10-2015-0084260 A | 7/2015 |
| WO | 2015/146674 A1 | 10/2015 |

\* cited by examiner

FLEXIBLE DISPLAY APPARATUS

CROSS-REFERENCE TO RELATED APPLICATION

This application claims priority to, and the benefit of, Korean Patent Application No. 10-2015-0172648, filed on Dec. 4, 2015 in the Korean Intellectual Property Office, the disclosure of which is incorporated herein in its entirety by reference.

BACKGROUND

1. Field

One or more embodiments relate to a flexible display apparatus in which both flexibility and a recovery property are improved.

2. Description of the Related Art

Among display apparatuses, an organic light-emitting display apparatus has not only a wide viewing angle and excellent contrast, but also has a quick response speed, and is therefore receiving attention as a next generation display apparatus.

Among display apparatuses, interest in a flexible display apparatus has recently increased, and studies on the flexible display apparatus are being actively conducted. To realize the flexible display apparatus, a flexible substrate formed of a material, such as synthetic resin, is used instead of a general glass substrate. Various layers including a displayer are stacked on the flexible substrate to realize the flexible display apparatus. At this time, an adhesive layer is located between the various layers while stacking the various layers.

However, in a general flexible display apparatus, when an adhesive layer that is between various layers of the general flexible display apparatus has a high elongation property, the general flexible display apparatus may have excellent flexibility, but may also have a relatively low recovery force. Contrastingly, when the adhesive layer has a high recovery property, the general flexible display apparatus may have an excellent recovery force, but may have relatively low flexibility.

SUMMARY

One or more embodiments include a flexible display apparatus in which both flexibility and a recovery property are improved.

Additional aspects will be set forth in part in the description that follows and, in part, will be apparent from the description, or may be learned by practice of the presented embodiments.

According to one or more embodiments, a flexible display apparatus includes a first functional layer, a second functional layer above the first functional layer, a third functional layer above the second functional layer, a first adhesive layer between the first functional layer and the second functional layer, and having a first recovery rate, and a second adhesive layer between the second functional layer and the third functional layer, and having a second recovery rate that is lower than the first recovery rate.

The first functional layer, the second functional layer, and the third functional layers may be foldable.

The third functional layer may include a first region at one side of a first axis, and a second region at another side of the first axis, wherein the first region and the second region face each other when the first, second, and third functional layers are folded based on the first axis.

The first region and the second region may form an angle between 0° and 180°.

The first recovery rate may be equal to or higher than 80%, and the second recovery rate may be lower than or equal to 80%.

The first functional layer may include a lower protective layer, the second functional layer may include a displayer for externally displaying an image, and the third functional layer may include a window for externally exposing the image displayed by the displayer.

The flexible display apparatus may further include a fourth functional layer between the second functional layer and the second adhesive layer, and a third adhesive layer between the second functional layer and the fourth functional layer.

The second adhesive layer and the third adhesive layer may each be thicker than the first adhesive layer.

The first functional layer may include a lower protective layer, the second functional layer may include a displayer for externally displaying an image, the third functional layer may include a window for externally exposing the image displayed by the displayer, and the fourth functional layer may include an optical film layer.

The third adhesive layer may have a third recovery rate that is higher than the second recovery rate and lower than the first recovery rate.

The first functional layer may include a lower protective layer, the second functional layer may include a displayer for externally displaying an image, the third functional layer may include a window for externally exposing the image displayed by the displayer, and the fourth functional layer may include a touch screen layer.

The flexible display apparatus may further include a fifth functional layer including an optical film layer between the second functional layer and the fourth functional layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
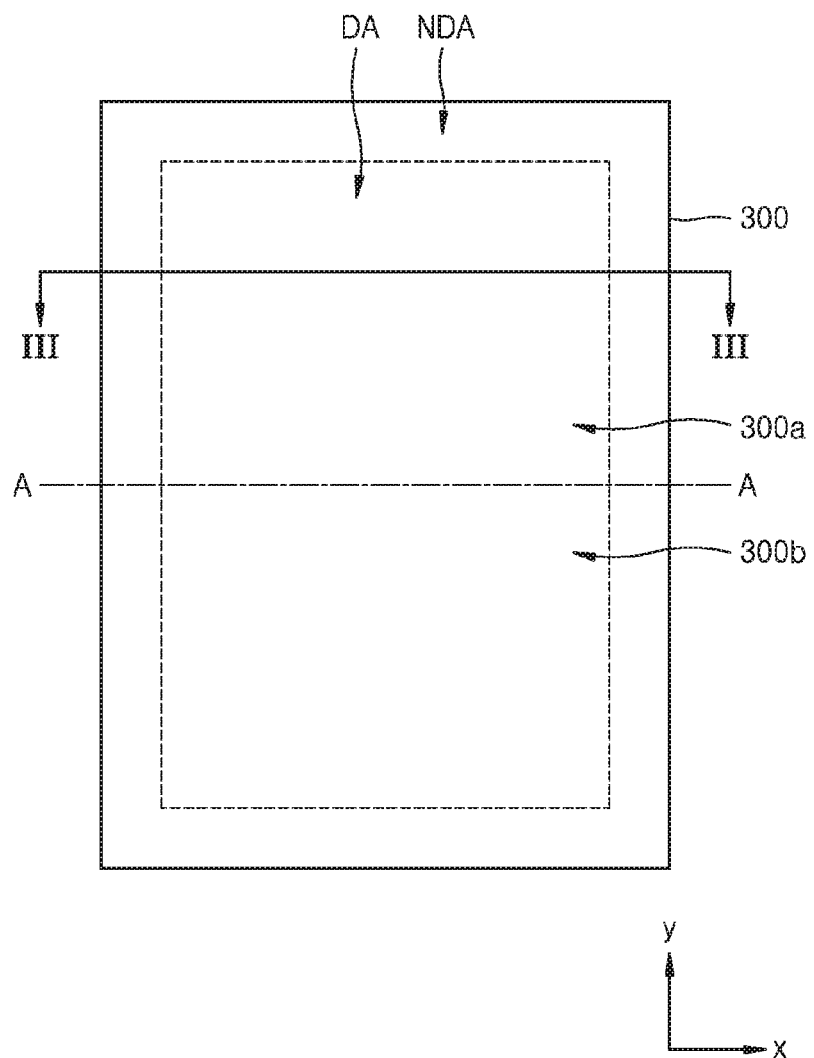
FIG. 1 is a plan view of a flexible display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
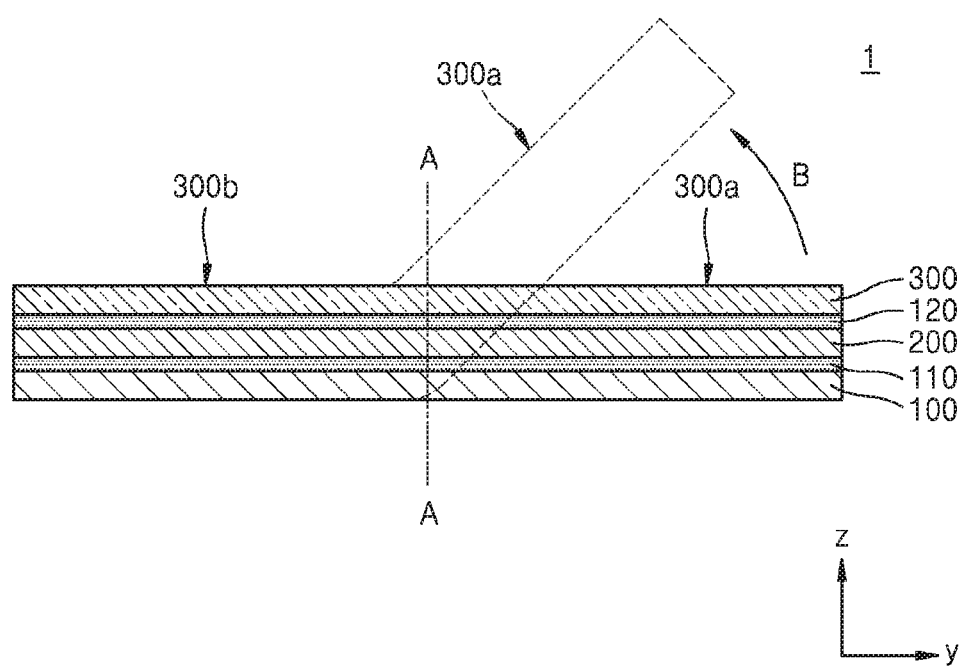
FIG. 2 is a lateral cross-sectional view of the flexible display apparatus of FIG. 1 in use, according to an embodiment.
Figure 3:
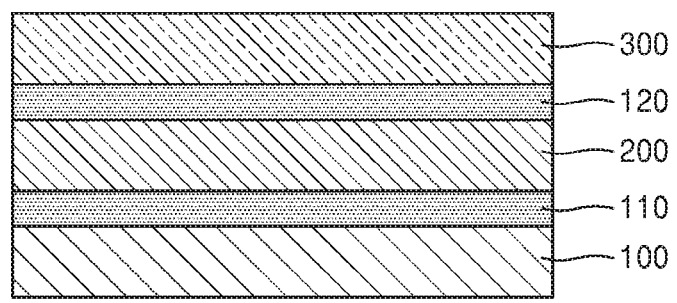
FIG. 3 is a cross-sectional view taken along the line III-III of FIG. 1.

FIG. 1 is a plan view of a flexible display apparatus according to an embodiment, FIG. 2 is a lateral cross-sectional view of the flexible display apparatus of FIG. 1 in use, according to an embodiment, and FIG. 3 is a cross-sectional view taken along the line III-III of FIG. 1.

Referring to FIGS. 1 through 3, the flexible display apparatus 1 according to an embodiment includes a first functional layer 100, a second functional layer 200, and a third functional layer 300, which are sequentially stacked on each other, and also includes a first adhesive layer 110 between the first functional layer 100 and the second functional layer 200, and a second adhesive layer 120 between the second functional layer 200 and the third functional layer 300.

The first functional layer 100 protects a lower surface of the flexible display apparatus 1, and may include a lower protective layer. The first functional layer 100 may be formed of a plastic material, such as polyethylene terephthalate (PET), polyethylene naphthalate (PEN), or polyimide (PI). The first functional layer 100 is at a side that is opposite to a side where an image is displayed on the flexible display apparatus 1, thereby protecting the flexible display apparatus 1 from external impurities or external impacts.

The second functional layer 200 may be located above the first functional layer 100. The second functional layer 200 generates an image, and externally displays the image, and may include a displayer. The second functional layer 200 may correspond to a panel of the flexible display apparatus 1. As shown in FIG. 1, the second functional layer 200 may include a display area DA including a thin-film transistor (TFT) (refer to FIG. 4) and a light-emitting device, and may also include a non-display area DNA outside the display area DA. The displayer may be located above the display area DA, and a flexible substrate 250 (refer to FIG. 4) for supporting the displayer may be exposed in the non-display area NDA where the displayer is not located. As described above, the displayer may include the light-emitting device, and, according to a type of the light-emitting device, the displayer may be a liquid crystal displayer or an organic light-emitting displayer. However, the invention is not particularly limited thereto, and a structure of the displayer will be described later with reference to FIG. 4.

The third functional layer 300 may be located above the second functional layer 200. The third functional layer 300 may include a window that externally exposes the image displayed on the displayer. The window may be located on an entire surface of the second functional layer 200 that generates the image to thereby protect the second functional layer 200 from oxygen and moisture penetration or external impacts. The third functional layer 300 may be formed of a glass material or a plastic material on which a barrier layer is coated. The third functional layer 300 may be at least twice as thick as other functional layers because a front surface of the third functional layer 300 protects various layers located below the third functional layer 300, as well as the second functional layer 200.

The first functional layer 100, the second functional layer 200, and the third functional layer 300 may be folded while being sequentially stacked on each other. In other words, the flexible display apparatus 1 according to the current embodiment including the first through third functional layers 100, 200 and 300 may be folded. As shown in FIG. 1, the flexible display apparatus 1 according to the current embodiment may be folded based on a first axis A-A. In FIG. 1, the first axis A-A crosses the center of the display area DA, but the present invention is not limited thereto. For example, when the first axis A-A is located as shown in FIG. 1, the flexible display apparatus 1 according to the current embodiment may be folded as shown in FIG. 2 when viewed from the side. In other words, the flexible display apparatus 1 according to the current embodiment may be realized to be repeatedly folded and unfolded based on the first axis A-A. Referring to FIG. 2, the flexible display apparatus 1 according to the current embodiment may be folded based on the first axis A-A, and thus the first through third functional layers 100 through 300, which are sequentially stacked on each other, may be folded based on the first axis A-A.

As described above, the third functional layer 300 may be located at an uppermost layer portion of the flexible display apparatus 1, while including the window. As shown in FIG. 1, the third functional layer 300 may include a first region 300a at one side of the first axis A-A, and a second region 300b at the other side of the first axis A-A. Here, when the third functional layer 300 is folded based on the first axis A-A, the first and second regions 300a and 300b of the third functional layer 300 may face each other. In other words, when the flexible display apparatus 1 is folded based on the first axis A-A, as shown in FIG. 2, the flexible display apparatus 1 is folded such that the third functional layer 300 is located inward and the first functional layer 100 is located outward. Accordingly, when the flexible display apparatus 1 is completely folded, only the first functional layer 100 is externally exposed, and the first and second regions 300a and 300b of the third functional layer 300 contact each other. In addition, when the flexible display apparatus 1 is completely folded, the displayer is also not externally exposed.

Referring to FIG. 2, the third functional layer 300 includes the first and second regions 300a and 300b based on, or separated by, the first axis A-A, and the first region 300a of the third functional layer 300 is folded along a folding direction B. Here, the first and second regions 300a and 300b may form an angle between 0° and 180° based on the first axis A-A. When the first and second regions 300a and 300b have an angle of 0° based on the first axis A-A, the flexible display apparatus 1 may be completely folded. At this time, the first and second regions 300a and 300b surface-contact each other. Also, when the first and second regions 300a and 300b form an angle of 180° based on the first axis A-A, the flexible display apparatus 1 may be completely unfolded and flat. As such, the flexible display apparatus 1 according to the current embodiment may be freely folded and unfolded within an angle between 0° and 180° based on the first axis A-A.

The first adhesive layer 110 may be located between the first and second functional layers 100 and 200. The first adhesive layer 110 may be closely adhered to the first and second functional layers 100 and 200 such that an air gap is not formed therebetween, thereby bonding the first and second functional layers 100 and 200 to each other. The first adhesive layer 110 may include an organic insulating material or a polymer material, which has an adhesive property, but the first adhesive layer 110 is not limited thereto. In the current embodiment, a pressure sensitive adhesive (PSA) may be used as an example of an adhesive material.

The second adhesive layer 120 may be located between the second and third functional layers 200 and 300. The second adhesive layer 120 may be closely adhered to the second and third functional layers 200 and 300 such that an air gap is not formed therebetween, thereby bonding the second and third functional layers 200 and 300 to each other. The second adhesive layer 120 may include an organic insulating material or a polymer material, which has an adhesive property, but is not limited thereto. In the current embodiment, a PSA may be used as an example of an adhesive material.

Because the first and second adhesive layers 110 and 120 are located between the first through third functional layers 100, 200, and 300, when the flexible display apparatus 1 is folded as described above, the first and second adhesive layers 110 and 120 may be folded together with the first through third functional layers 100, 200, and 300.

The first adhesive layer 110 may have a first recovery rate, and the second adhesive layer 120 may have a second recovery rate. Here, a recovery rate denotes a recovery characteristic, and is obtained by adhering a film on both surfaces of an adhesive layer, and by then measuring a recovery degree of the adhesive layer upon removing a uniform load that is applied to the film adhered on one surface based on the film adhered on the other surface in a horizontal direction. In the current embodiment, a recovery degree of an adhesive layer is measured 6 seconds after removal of the load applied to a film adhered on one surface of the adhesive layer based on a film adhered on the other surface of the adhesive layer in a horizontal direction, wherein the load is applied for 120 minutes at 3 N.

In the flexible display apparatus 1 according to the current embodiment, the second recovery rate of the second adhesive layer 120 may be lower than the first recovery rate of the first adhesive layer 110. Here, a low recovery rate denotes a high elongation property, and the second adhesive layer 120 having the second recovery rate that is lower than the first recovery rate may have a higher elongation property than the first adhesive layer 110. For example, the first adhesive layer 110 may have the first recovery rate equal to or higher than 80%, and the second adhesive layer 120 may have the second recovery rate lower than or equal to 80%. At this time, a recovery rate of 80% means 80% of recovery force when the load is removed.

While the flexible display apparatus 1 is folded, stress is applied to the flexible display apparatus 1 including a folding region. Here, when the first and second adhesive layers 110 and 120 located between respective ones of the first through third functional layers 100, 200, and 300 both have high elongation and a low recovery rate, then stress applied to each layer is thereby reduced when the flexible display apparatus 1 is folded. Accordingly, when the flexible display apparatus 1 itself is fixedly bent or folded at a certain angle, an adhesive layer having high elongation may be used. However, when the flexible display apparatus 1 is to be repeatedly folded and unfolded, according to an embodiment, inter-layer stress may be reduced if an adhesive layer having high elongation is used, although a recovery force for recovering the flexible display apparatus 1 after folding is remarkably reduced, and thus a percentage of defective products may increase.

Accordingly, in the flexible display apparatus 1 according to an embodiment, recovery rates of adhesive layers located between stacked layers vary by taking into account that thicknesses and radii of curvature of the stacked layers are different in a folding direction. When the flexible display apparatus 1 is folded, the third functional layer 300 located inward may include a window having a lowest radius of curvature, and may be relatively thick compared to other functional layers. Accordingly, the second recovery rate may be lower than the first recovery rate while forming the second adhesive layer 120 contacting the third functional layer 300 to have the second recovery rate, and while forming the first adhesive layer 110 contacting the first functional layer 100 to have the first recovery rate. Accordingly, the flexible display apparatus 1 that is intended to be repeatedly folded and unfolded may have both flexibility and excellent recovery force.

Figure 4:
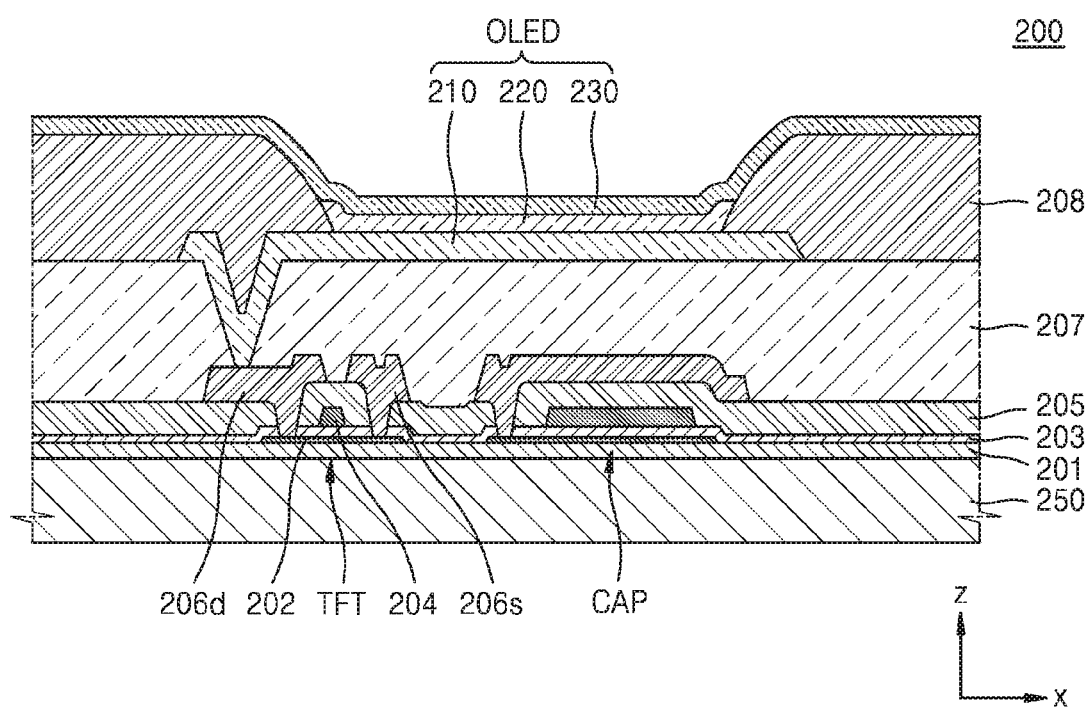
FIG. 4 is a cross-sectional view of a partial cross-section structure of a displayer of the flexible display apparatus of FIG. 1.

FIG. 4 is a cross-sectional view of a partial cross-section structure of the second functional layer 200 of the flexible display apparatus 1 of FIG. 1. As described above, the second functional layer 200 may include the displayer for displaying an image, wherein the displayer may be a liquid crystal displayer or an organic light-emitting displayer. In the current embodiment, the displayer is an organic light-emitting displayer.

Referring to FIG. 4, the displayer is located above the flexible substrate 250. The flexible substrate 250 has a flexible characteristic, and may be formed of any one of various materials, such as a metal material and a plastic material such as PET, PEN, or PI.

A buffer layer 201, formed of, for example, silicon oxide or silicon nitride, may be located above the flexible substrate 250 to flatten/planarize a surface of the flexible substrate 250, or to prevent impurities from penetrating into a semiconductor layer 202 of the thin-film transistor. The semiconductor layer 202 may be located above the buffer layer 201.

A gate electrode 204 is located above the semiconductor layer 202, and a source electrode 206s and a drain electrode 206d are electrically connected to each other according to a signal applied to the gate electrode 204. The gate electrode 204 may include a single layer or may include a multilayer formed of at least one material from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), while taking into account adhesiveness with an adjacent layer, and surface flatness and processability of a stacked layer.

Here, to secure insulation between the semiconductor layer 202 and the gate electrode 204, a gate insulating layer 203, formed of silicon oxide and/or silicon nitride, may be located between the semiconductor layer 202 and the gate electrode 204.

An interlayer insulating layer 205 may be located above the gate electrode 240, and may include a single layer or a multilayer formed of a material, such as silicon oxide or silicon nitride.

The source electrode 206s and the drain electrode 206d are located above the interlayer insulating layer 205. The source electrode 206s and the drain electrode 206d are electrically connected to the semiconductor layer 202 through contact holes in the interlayer insulating layer 205 and the gate insulating layer 203. The source electrode 206s and the drain electrode 206d may include a single layer or may include a multilayer formed of at least one material from among, for example, Al, Pt, Pd, Ag, Mg, Au, Ni, Nd, Ir, Cr, Li, Ca, Mo, Ti, W, and/or Cu, while taking into account conductivity.

Furthermore, a protective layer for covering the thin-film transistor TFT may be provided to protect the thin-film transistor TFT. The protective layer may be formed of an inorganic material, such as silicon oxide, silicon nitride, or silicon oxynitride.

Figure 5:
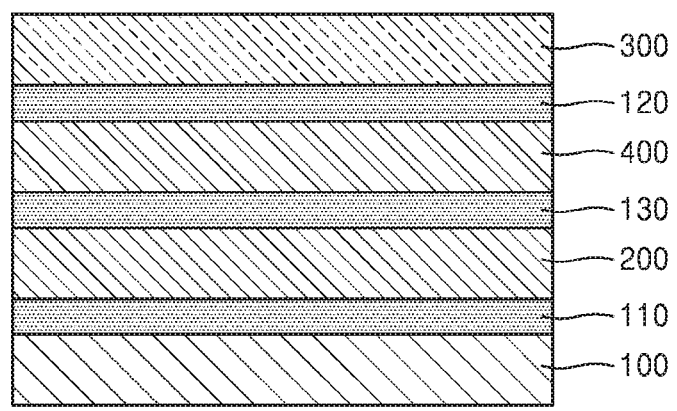
FIG. 5 is a cross-sectional view of a flexible display apparatus according to another embodiment.

Meanwhile, a first insulating layer 207 may be located above the flexible substrate 250. In this case, the first insulating layer 207 may be a planarization layer or a protective layer. When the organic light-emitting device is located above the thin-film transistor TFT, the first insulating layer 207 generally flattens a top surface of the thin-film transistor TFT, and also protects the thin-film transistor TFT and various devices. The first insulating layer 207 may be formed of, for example, an acryl-based organic material or benzocyclobutene (BCB). At this time, as shown in FIG. 5, the buffer layer 201, the gate insulating layer 203, the interlayer insulating layer 205, and the first insulating layer 207 may be formed on an entire surface of the flexible substrate 250.

Meanwhile, a second insulating layer 208 may be located above the thin-film transistor TFT. At this time, the second insulating layer 208 may be a pixel defining layer. The second insulating layer 208 may be located above the first insulating layer 207 described above, and may have/define an opening. The second insulating layer 208 may define a pixel region on the flexible substrate 250.

The second insulating layer 208 may include, for example, an organic insulating layer. The organic insulating layer may include an acryl-based polymer such as polymethyl methacrylate (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, or a mixture thereof.

Meanwhile, an organic light-emitting device OLED may be located above the second insulating layer 208. The organic light-emitting device OLED may include a pixel electrode 210, an intermediate layer 220 including an emission layer (EML), and a counter electrode 230.

The pixel electrode 210 may be a transparent/semi-transparent electrode or a reflective electrode. When the pixel electrode 210 is a (semi-)transparent electrode, the pixel electrode 210 may be formed of, for example, indium tin oxide (ITO), indium zinc oxide (IZO), zinc oxide (ZnO), indium oxide (In2O3), indium gallium oxide (IGO), and/or aluminum zinc oxide (AZO). When the pixel electrode 210 is a reflective electrode, the pixel electrode 210 may include a reflective film formed of Ag, Mg, Al, Pt, Pd, Au, NI, Nd, Ir, Cr, and/or a compound thereof, and a layer formed of ITO, IZO, ZnO, In2O3, IGO, and/or AZO. However, an embodiment is not limited thereto, and the pixel electrode 210 may be formed of any one of various materials, or may include a single layer or a multilayer.

The intermediate layer 220 may be located in each pixel region defined by the second insulating layer 208. The intermediate layer 220 includes the emission layer EML for emitting light according to an electric signal, and may further include at least one of a hole injection layer (HIL) and a hole transport layer (HTL), which are located between the emission layer EML and the pixel electrode 210, and may also further an electron transport layer (ETL) and an electron injection layer (EIL), which are located between the emission layer EML and the counter electrode 230. However, a structure of the intermediate layer 220 is not limited thereto and may vary.

The counter electrode 230 that covers the intermediate layer 220 including the emission layer EML and faces the pixel electrode 210 may be located throughout, or across, an entire surface of the flexible substrate 250. The counter electrode 230 may be a (semi-)transparent electrode or a reflective electrode.

When the counter electrode 230 is a (semi-)transparent electrode, the counter electrode 230 may include a layer formed of a metal having a low work function, such as Li, Ca, LiF/Ca, LiF/Al, Al, Ag, Mg, and/or a compound thereof, and a (semi-)transparent conductive layer formed of ITO, IZO, ZnO, and/or In$_2$O$_3$. When the counter electrode 230 is a reflective electrode, the counter electrode 230 may include a layer formed of Li, Ca, LiF/Ca, LiF/Al, Al, Ag, Mg, and/or a compound thereof. However, a structure and material of the counter electrode 230 are not limited thereto, and may vary.

Meanwhile, in other embodiments, a thin-film encapsulation layer, in which an organic film and an inorganic film are alternately stacked on each other, may be further provided above the counter electrode 230.

FIG. 5 is a cross-sectional view of a flexible display apparatus 2 according to another embodiment.

Referring to FIG. 5, the flexible display apparatus 2 according to the current embodiment may further include a fourth functional layer 400 and a third adhesive layer 130. Because a structure of the flexible display apparatus 2 is the same as the structure of the flexible display apparatus 1 described above with reference to FIGS. 1-4, with the exception of the fourth functional layer 400 and the third adhesive layer 130, only the fourth functional layer 400 and the third adhesive layer 130 are now described.

The fourth functional layer 400 may be located between the second functional layer 200 and the second adhesive layer 120. The fourth functional layer 400 may include a touch screen layer that is capable of controlling the flexible display apparatus 2 when a user directly touches an image externally exposed to the user. According to another embodiment, the fourth functional layer 400 may include an optical film layer that increases optical extraction efficiency, such that light generated by the second functional layer 200 is easily externally emitted.

The third adhesive layer 130 may be located between the second functional layer 200 and the fourth functional layer 400. The third adhesive layer 130 may be closely adhered to the second functional layer 200 and the fourth functional layer 400 such that an air gap is not formed therebetween, thereby bonding the second functional layer 200 and the fourth functional layer 400 to each other. The third adhesive layer 130 may include an organic insulating material or a polymer material having an adhesive characteristic, but an embodiment is not limited thereto. In the current embodiment, a PSA may be used as an example of an adhesive material.

The third adhesive layer 130 may have a third recovery rate. In the flexible display apparatus 2 according to the current embodiment, the third recovery rate of the third adhesive layer 130 may be higher than the second recovery rate and lower than the first recovery rate. In other words, the second adhesive layer 120, the third adhesive layer 130, and the first adhesive layer 110 may be sequentially arranged based on the third functional layer 300 that includes the window and is an uppermost layer, and may have recovery rates gradually increasing in the stated order.

Figure 6:
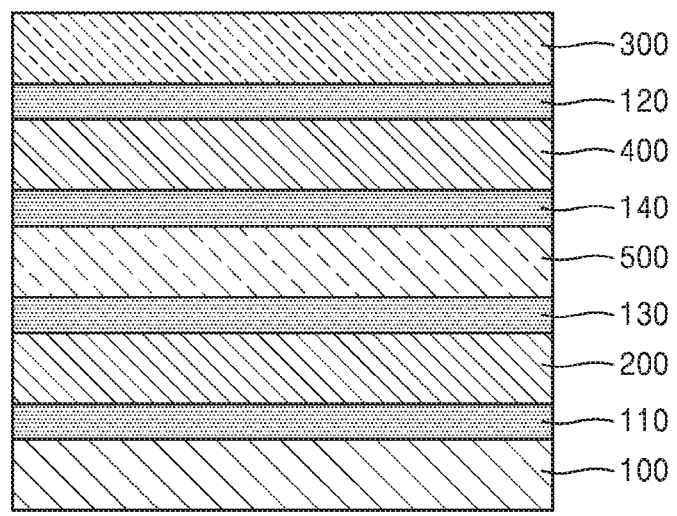
FIG. 6 is a cross-sectional view of a flexible display apparatus according to another embodiment.

FIG. 6 is a cross-sectional view of a flexible display apparatus 3 according to another embodiment.

Referring to FIG. 6, the flexible display apparatus 3 according to an embodiment may further include a fifth functional layer 500 and a fourth adhesive layer 140. Because a structure of the flexible display apparatus 3 is the same as the structure of the flexible display apparatus 2 described above with reference to FIG. 5, with the exception of the presence of the fifth functional layer 500 and the fourth adhesive layer 140, only the fifth functional layer 500 and the fourth adhesive layer 140 are now described.

The fifth functional layer 500 may be located between the third adhesive layer 130 and the fourth functional layer 400. In the flexible display apparatus 3 including both the fourth functional layer 400 and the fifth functional layer 500, as in the current embodiment, the fourth functional layer 400 may include a touch screen layer, and the fifth functional layer 500 may include an optical film layer. According to another embodiment, the fourth functional layer 400 may include an optical film layer, and the fifth functional layer 500 may include a touch screen layer.

The fourth adhesive layer 140 may be located between the fourth functional layer 400 and the fifth functional layer 500. The fourth adhesive layer 140 may be closely adhered to the fourth functional layer 400 and the fifth functional layer 500 such that an air gap is not formed therebetween, thereby bonding the fourth functional layer 400 and the fifth functional layer 500 to each other. The fourth adhesive layer 140 may include an organic insulating material or a polymer material having an adhesive characteristic, but the present invention is not limited thereto. In the current embodiment, a PSA may be used an example of an adhesive material.

The fourth adhesive layer 140 may have a fourth recovery rate. In the flexible display apparatus 3 according to the current embodiment, the fourth recovery rate of the fourth adhesive layer 140 may be higher than the second recovery rate and lower than the third recovery rate. In other words, the second adhesive layer 120, the fourth adhesive layer 140, the third adhesive layer 130, and the first adhesive layer 110 may be sequentially arranged based on the third functional layer 300 that includes the window and is an uppermost layer, and may have recovery rates gradually increasing in the stated order.

Figure 7:
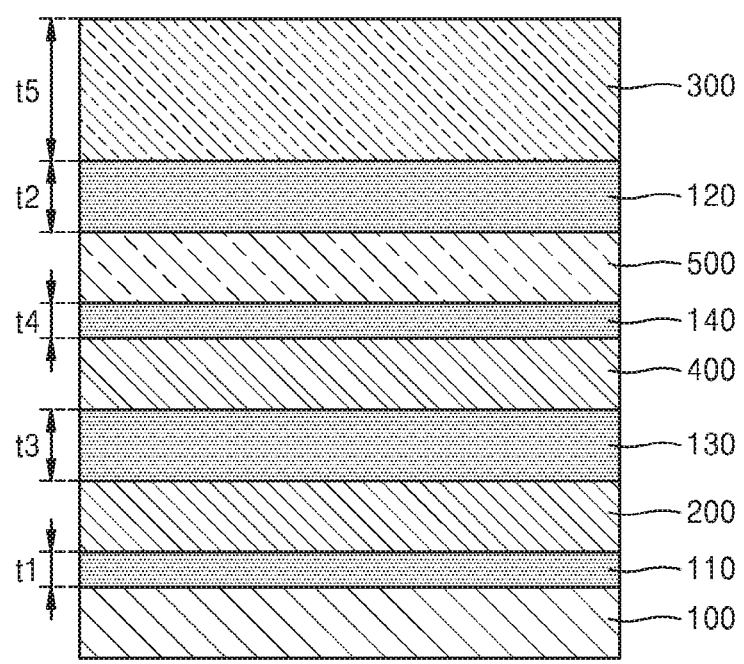
FIG. 7 is a cross-sectional view of a flexible display apparatus according to another embodiment.

FIG. 7 is a cross-sectional view of a flexible display apparatus 4 according to another embodiment.

Referring to FIG. 7, the flexible display apparatus 4 has the same structure as the flexible display apparatus 3 of FIG. 6, except that thicknesses of the first through fourth adhesive layers 110 through 140 are different according to thicknesses and functions of corresponding functional layers.

According to the current embodiment, the third functional layer 300 may have a thickness t5 thicker than other functional layers. Because a front surface of the third functional layer 300 protects various layers provided therebelow, the thickness t5 of the third functional layer 300 may be twice thicker than other functional layers.

Meanwhile, a thickness t3 of the third adhesive layer 130 and a thickness t2 of the second adhesive layer 120 may be thicker than a thickness t1 of the first adhesive layer 110 or a thickness t4 of the fourth adhesive layer 140. Generally, the thickness t3 of the third adhesive layer 130 and the thickness t2 of the second adhesive layer 120 may be about twice that of the thickness t1 of the first adhesive layer 110 or the thickness t4 of the fourth adhesive layer 140, but a numerical limitation of a thickness is not limited thereto.

Because the second adhesive layer 120 is located between the third functional layer 300 and the fourth functional layer 400 to directly contact the third functional layer 300, the third functional layer 300 including the window may have higher hardness and a thicker thickness than other functional layers. Also, the second adhesive layer 120 that is located below the third functional layer 300 and has increased stress according to the third functional layer 300 during folding may be thicker than the first or fourth adhesive layer 110 or 140, which only performs a simple adhering function.

Also, because the third adhesive layer 130 is located between the second functional layer 200 and the fourth functional layer 400, the third adhesive layer 130 located above the second functional layer 200 may be thicker than the first or fourth adhesive layer 110 or 140, which only performs a simple adhering function, to thereby protect the second functional layer 200 that includes the displayer that is vulnerable to external impact or moisture penetration.

As described above, according to one or more embodiments, a flexible display apparatus in which both flexibility and a recovery property are improved may be realized.

While one or more embodiments have been described with reference to the figures, it will be understood by those of ordinary skill in the art that various changes in form and details may be made therein without departing from the spirit and scope as defined by the following claims and their functional equivalents.

What is claimed is:

1. A flexible display apparatus comprising:
a first functional layer including a lower protective layer, the lower protective layer having a plastic material;
a second functional layer including a display panel above the first functional layer, the display panel including a flexible substrate and a light-emitting device on the flexible substrate;
a third functional layer including an upper protective layer above the second functional layer, and the upper protective layer;
a first adhesive layer between the first functional layer and the second functional layer, and having a first recovery rate; and
a second adhesive layer comprising a same polymer material as the first adhesive layer between the second functional layer and the third functional layer, and having a second recovery rate that is lower than the first recovery rate due to the second adhesive layer having a thickness that is greater than that of the first adhesive layer and/or due to the second adhesive layer having a radius of curvature that is less than that of the first adhesive layer,
wherein a recovery rate is calculated by applying a load of 3 N for 120 minutes to an adhesive layer, and measuring a degree to which the adhesive layer has recovered 6 seconds after removal of the load,
wherein the first adhesive layer and the second adhesive layer include a pressure sensitive adhesive material,
wherein the third functional layer is thicker than the first functional layer and the second functional layer, and the second functional layer is disposed directly below the third functional layer to make surface contact, and
wherein during bending the flexible display apparatus, the third functional layer has a smaller radius of curvature than the first functional layer and the second functional layer.

2. The flexible display apparatus of claim 1, wherein the first functional layer, the second functional layer, and the third functional layer are foldable.

3. The flexible display apparatus of claim 2, wherein the third functional layer comprises:
a first region at one side of a first axis; and
a second region at another side of the first axis,
wherein the first region and the second region face each other when the first, second, and third functional layers are folded based on the first axis.

4. The flexible display apparatus of claim 3, wherein the first region and the second region form an angle between 0° and 180°.

5. The flexible display apparatus of claim 1, wherein the first functional layer comprises a lower protective layer,
wherein the second functional layer comprises a displayer for externally displaying an image, and
wherein the third functional layer comprises a window for externally exposing the image displayed by the displayer.

6. The flexible display apparatus of claim 1, further comprising:
   a fourth functional layer between the second functional layer and the second adhesive layer; and
   a third adhesive layer between the second functional layer and the fourth functional layer.

7. The flexible display apparatus of claim 6, wherein the second adhesive layer and the third adhesive layer are each thicker than the first adhesive layer.

8. The flexible display apparatus of claim 7, wherein the first functional layer comprises a lower protective layer,
   wherein the second functional layer comprises a displayer for externally displaying an image,
   wherein the third functional layer comprises a window for externally exposing the image displayed by the displayer, and
   wherein the fourth functional layer comprises an optical film layer.

9. The flexible display apparatus of claim 6, wherein the third adhesive layer has a third recovery rate that is higher than the second recovery rate and lower than the first recovery rate.

10. The flexible display apparatus of claim 9, wherein the first functional layer comprises a lower protective layer,
    wherein the second functional layer comprises a displayer for externally displaying an image,
    wherein the third functional layer comprises a window for externally exposing the image displayed by the displayer, and
    wherein the fourth functional layer comprises a touch screen layer.

11. The flexible display apparatus of claim 10, further comprising a fifth functional layer comprising an optical film layer between the second functional layer and the fourth functional layer.

* * * * *